(12) United States Patent
Mangalore Anand et al.

(10) Patent No.: US 11,764,789 B2
(45) Date of Patent: Sep. 19, 2023

(54) ADAPTIVE BIASING CIRCUIT FOR SERIAL COMMUNICATION INTERFACES

(71) Applicant: ADVANCED MICRO DEVICES, INC., Santa Clara, CA (US)

(72) Inventors: Rajesh Mangalore Anand, Bangalore (IN); Prasant Kumar Vallur, Hyderabad (IN); Piyush Gupta, Noida (IN); Girish Anathahalli Singrigowda, Bangalore (IN); Jagadeesh Anathahalli Singrigowda, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/487,569

(22) Filed: Sep. 28, 2021

(65) Prior Publication Data
US 2023/0095805 A1 Mar. 30, 2023

(51) Int. Cl.
*H03K 19/17788* (2020.01)
*H03K 19/0185* (2006.01)
*H03K 19/003* (2006.01)

(52) U.S. Cl.
CPC . *H03K 19/17788* (2013.01); *H03K 19/00315* (2013.01); *H03K 19/00384* (2013.01); *H03K 19/018507* (2013.01)

(58) Field of Classification Search
None
See application file for complete search history.

(56) References Cited

U.S. PATENT DOCUMENTS 6,294,943 B1    9/2001    Wall et al.
2014/0002146 A1*    1/2014    Kim ............... H03K 19/018521
                                         327/333

OTHER PUBLICATIONS

"THE 1 2C-BUS Specification" Philips Semiconductors. 2000. 46 Pages.

* cited by examiner

*Primary Examiner* — Jany Richardson (57) ABSTRACT

Systems and techniques for applying voltage biases to gates of driver circuitry of an integrated circuit (IC) based on a detected bus voltage, IC supply voltage, or both are used to mitigate Electrical Over-Stress (EOS) issues in components of the driver circuitry caused, for instance, by high bus voltages in serial communication systems relative to maximum operating voltages of those components. A driver bias generator selectively applies bias voltages at gates of transistors of a stacked driver structure of an IC to prevent the voltage drop across any given transistor of the stacked driver structure from exceeding a predetermined threshold associated with the maximum operating voltage range of the transistors.

19 Claims, 5 Drawing Sheets

ADAPTIVE BIASING CIRCUIT FOR SERIAL COMMUNICATION INTERFACES

BACKGROUND

Serial communication systems typically use one or more buses to transfer data, execute handshake operations, and perform bus arbitration schemes. To perform these operations, the buses typically use bus voltages ranging from 1.8 V to 3.3 V. In some cases, transistors of an integrated circuit device that is part of a serial communication system are not rated to handle such high bus voltages and can experience electrical over-stress (EOS). EOS of components in a device can cause degradation of device performance or even failure of the device.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

When communicating via a bus in a serial communication system, one device is designated as the primary device, while the other devices are designated as secondary devices. The primary device controls the serial communication system and is responsible for establishing communications with and between the secondary devices present in the system. When transferring data in a conventional serial communications system, bits of data are transferred between devices one at a time ("serially"). Serial communications standards, such as Inter-Integrated Circuit (I2C), SenseWire (I3C), Serial Peripheral Interface (SPI), and Universal Asynchronous Receiver-Transmitter (UART) protocols, typically allow for various operating voltages to be supplied to the bus (i.e., "bus voltages"), ranging from 1.8 V to 3.3 V. However, these voltages can result in EOS of a components of the serial communication system, such as the transistors of a secondary device. Systems and techniques described herein utilize a driver bias generator to selectively apply bias voltages to gates of transistors of driver circuitry (e.g., a stacked driver structure) of an IC that is coupled to a bus. The driver bias generator detects either or both of a bus voltage and an IC supply voltage. The bias voltages applied to the gates of the transistors are set by the driver bias generator based, at least in part, on these detected voltages. By selectively applying bias voltages to gates of the driver circuitry in this way, the driver bias generator prevents the voltage across any given transistor of the driver circuitry from exceeding a predetermined threshold (e.g., a maximum operating voltage range associated with that transistor). The components of the communication system are thus protected from EOS.

To illustrate, conventionally a constant voltage bias is applied to driver circuitry of a serial communications interface of an IC in order to reduce the occurrence of EOS issues. However, such constant biasing techniques are not useful when attempting to protect driver circuitry that includes transistors with a maximum operating voltage range of around 1.65 V when that driver circuitry is coupled to a system (e.g., to a bus of a serial communication system) that operates at a higher voltage range of about 1.8 V to 3.3 V, since the transistors would still be vulnerable to EOS. Furthermore, conventional constant biasing techniques cannot always provide the gate-to-source voltages needed to operate bus-connected transistors in their saturation regions to meet desired direct current (DC) and alternating current (AC) characteristics. In contrast, the systems and techniques described herein dynamically apply bias voltages to transistors of the driver circuitry based on either or both of a bus voltage and an IC supply voltage. Applying bias voltages to the transistors of the driver circuitry dynamically in this way better mitigates EOS at transistors of the driver circuitry and more reliably ensures that the transistors are able to operate in their saturation regions when such operation is desirable.

Figure 1:
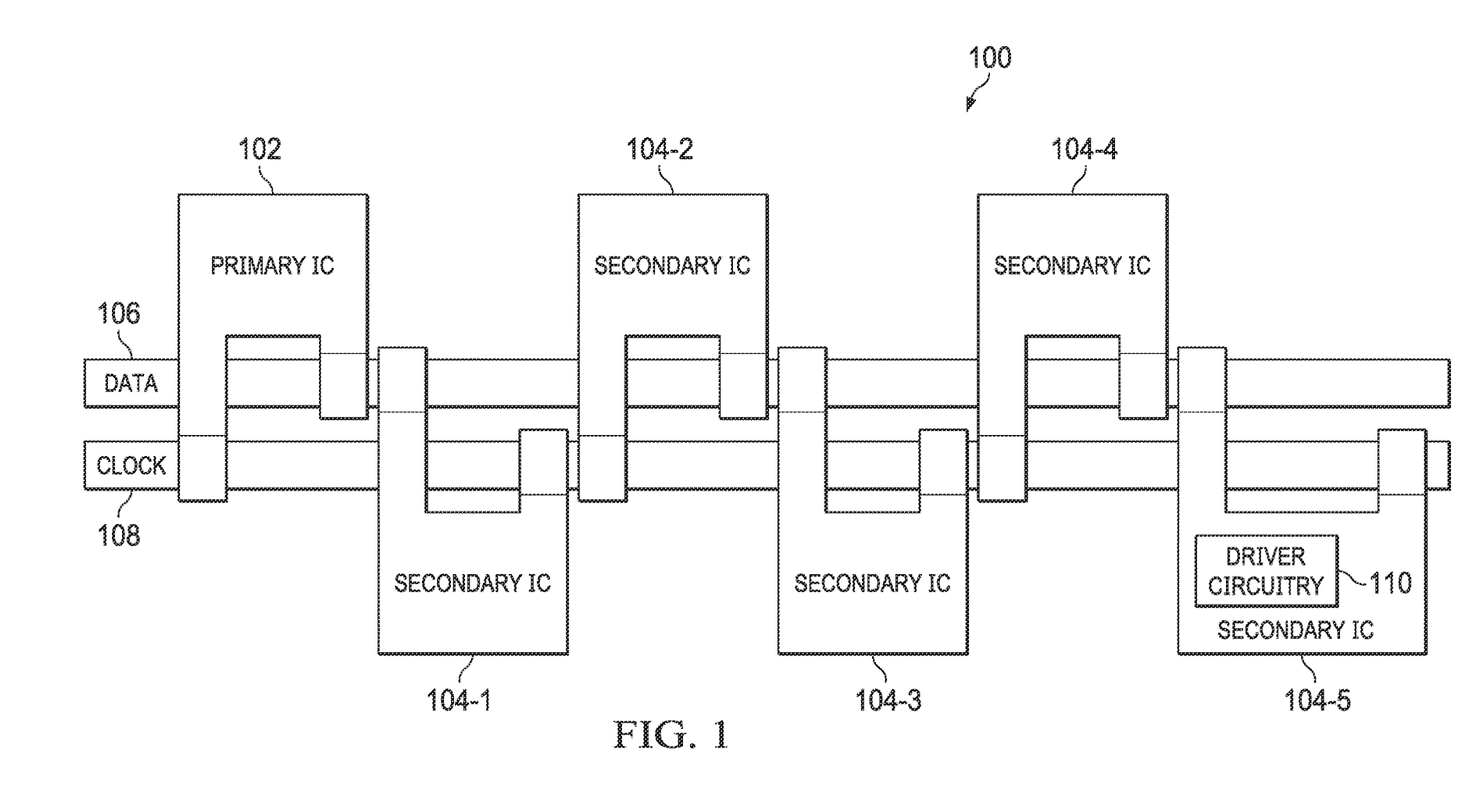
FIG. 1 is a block diagram of a serial communication system having at least one secondary device with driver circuitry configured for mitigating bus-based Electrical Over-Stress (EOS), in accordance with some embodiments.

FIG. 1 illustrates a serial communication system 100 that includes a primary integrated circuit 102 and multiple secondary ICs 104 that are each coupled to a data bus 106 and a clock signal line 108. According to various embodiments, the serial communication system 100 utilizes a serial communication protocol, such as I2C, I3C, SPI, or UART, having an operating voltage of about 1.8 V to 3.3 V. The primary IC 102 and the secondary ICs 104 are, according to various embodiments, application specific integrated circuits (ASICs), field programmable gate arrays (FPGAs) or general purpose integrated circuits.

During operation of the serial communication system 100, the primary IC 102 and the secondary ICs 104 communicate with one another by sending data, one bit at a time, over the data bus 106 by applying voltages to the data bus 106. Timing of such communications is synchronized across the primary IC 102 and the secondary ICs 104 via a clock signal supplied (by the primary IC 102, for example) at the clock signal line 108. Typically, in serial communication systems such as the serial communication system 100 there are instances in which one secondary device, such as the secondary IC 104-1 is communicating with the primary IC 102 while the other secondary ICs 104 are disabled. In such scenarios, bus connected transistors of the disabled ICs of the secondary ICs 104 are exposed to stress caused by voltages applied to the data bus 106 by the active IC 104 or the primary IC 102. Accordingly, by adaptively biasing such transistors of the secondary ICs 104 based, at least in part, on the voltage sensed at the data bus 106, the transistors are exposed to less stress and likelihood of impaired performance or failure of these transistors is decreased.

In the present example, one or more of the secondary ICs 104, including the secondary IC 104-5, includes self-sensing driver circuitry 110 that is configured to apply bias voltages to one or more transistors (e.g., metal oxide semiconductor field effect transistors (MOSFETs)) of the self-sensing driver circuitry based on at least the voltage at the data bus 106 and an IC supply voltage coupled to the driver circuitry 110. The respective values of the applied bias voltages cause the maximum voltage across each associated transistor to not exceed a maximum operating voltage of that transistor, which mitigates potential EOS issues that might otherwise be caused at these transistors by voltages at the data bus 106.

Figure 2:
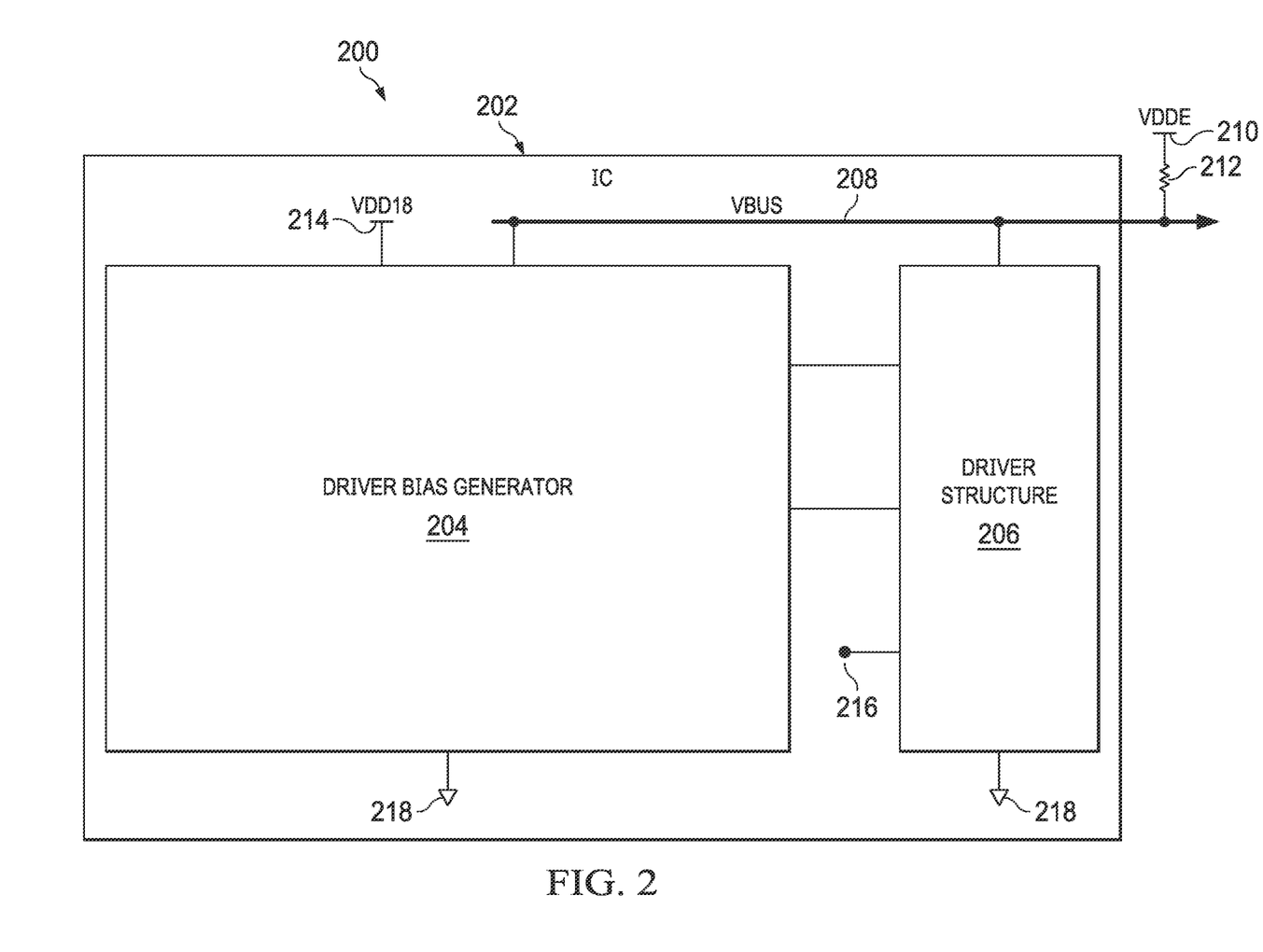
FIG. 2 is a block diagram of an integrated circuit (IC) device that is coupled to a bus and that includes a driver structure and a driver bias generator that applies voltage biases to the driver structure to mitigate EOS that would otherwise be caused by voltages supplied to the bus, in accordance with some embodiments.

FIG. 2 illustrates a system 200 that includes an IC 202 (sometimes referred to herein as an "IC device 202") that is coupled to a bus 208 that is coupled to an external voltage supply 210 via an external pullup resistance 212. In some embodiments, the system 200 is part of a serial communication system such as an embodiment of the serial communication system 100 of FIG. 1, the IC 202 is secondary IC of the serial communication system, such as an embodiment of one of the secondary ICs 104 of FIG. 1, and the bus 208 is a data bus of the serial communication system, such as an embodiment of the data bus 106 of FIG. 1. In some embodiments, the external voltage supply 210 represents multiple external voltage supplies of other secondary ICs or a primary IC of the serial communication system, which periodically apply a voltage (e.g., about 1.8 V or about 3.3 V) to the bus 208 when communicating via the serial communication system. In some embodiments, the pullup resistances of each of the other secondary ICs and the primary IC of the serial communication system are collectively represented as the external pullup resistance 212.

The IC 202 includes a driver bias generator 204 and a driver structure 206. The driver bias generator 204 and the driver structure 206 are included in some embodiments of the driver circuitry 110 of FIG. 1, for example. The driver bias generator 204 is configured to detect an IC supply voltage, VDD18, provided by an IC voltage supply 214 and to detect a bus voltage, VBUS, at the bus 208. The driver bias generator 204 then supplies bias voltages to transistors of the driver structure 206 based on the detected values of VBUS and VDD18 in order to prevent voltages across the transistors of the driver structure 206 from exceeding their respective maximum operating voltages. This mitigates EOS issues at those transistors, which would otherwise be caused by the voltage VBUS.

The driver structure 206, in some embodiments, is a stacked NMOS driver structure. In some embodiments, the stacked NMOS driver structure includes three transistors, and two transistors closest to the bus 208 are biased by the driver bias generator 204. In some embodiments, the transistors of either or both of the driver bias generator 204 and the driver structure 206 are fin field effect transistors (FinFETs) that are fabricated using a 5 nm lithographic process (such transistors are sometimes referred to herein as "5 nm FinFET transistors"). 5 nm FinFET transistors typically have a maximum operating voltage of about 1.65 V (e.g., 1.5 V+10%), which is lower than the maximum operating voltage of earlier MOSFET technologies fabricated using 14 nm or 7 nm lithographic processes, which were configured to operate in the 3.3 V and 1.8 V voltage domains, respectively. Thus, in order to reduce the likelihood of EOS issues in 5 nm FinFET transistors, each of the gate-source, gate-drain, gate-bulk, and drain-source voltages of each transistor should be less than 1.65 V. Accordingly, the voltage biases applied by the driver bias generator 204 ensure that any of these voltages are less than 1.65 V for embodiments in which the transistors of the transistors of the driver structure 206 are FinFET transistors or otherwise have 1.65 V maximum operating voltages. In some embodiments, the driver structure 206 is manufactured via a bulk process. In some embodiments, the transistors of either or both of the driver bias generator 204 and the driver structure 206 are NMOS transistors fabricated using a deep N-well process by which the P-well of a given NMOS transistor is isolated from the substrate (that is, the transistors are "deep N-well devices"), and the bulk terminal of each transistor can be biased to voltages other than ground, which further helps to mitigate EOS issues. In some embodiments, the bulk terminal of each transistor of either or both of the driver bias generator 204 and the driver structure 206 is configured to be tied to the highest potential terminal (of the gate terminal or the source terminal, for example) of that transistor to avoid leakage issues (e.g., forward-biasing of the bulk-source or bulk-drain parasitic diodes of the transistor) and to avoid destructive latch-up effects. Both the driver bias generator 204 and the driver structure 206 are coupled to the bus 208 and to a ground 218 (sometimes referred to herein as a "ground terminal 218"). In some embodiments, the ground 218 is biased to a ground voltage (e.g., about 0 V).

Figure 3:
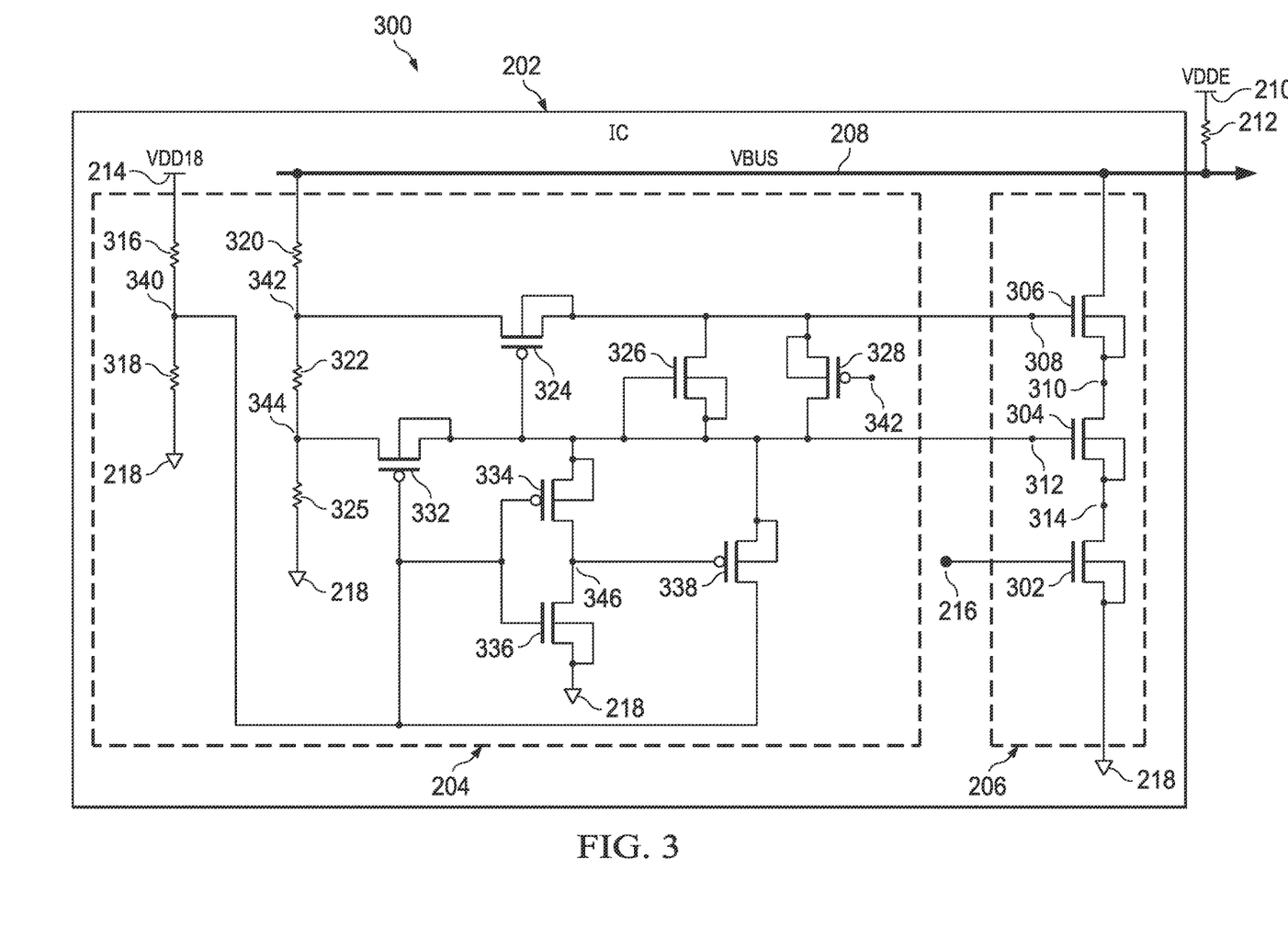
FIG. 3 is a block diagram showing an example of circuit components included in the driver structure and the driver bias generator of an embodiment of the IC device of FIG. 2, in accordance with some embodiments.

FIG. 3 illustrates a system 300 corresponding to an embodiment of the system 200 in which example components of the driver bias generator 204 and the driver structure 206 are shown. In the present example, the driver structure 206 includes a first driver structure transistor 302, a second driver structure transistor 304, and a third driver structure transistor 306, each of which are NMOS transistors in the present example, while the driver bias generator 204 includes NMOS transistors 326 and 336 and P-channel metal oxide semiconductor (PMOS) transistors 324, 328, 332, 334, 338. According to various embodiments, the driver structure 206 is a stacked NMOS driver structure and the driver structure transistors 302, 304, and 306 of the driver structure 206 are each 5 nm NMOS FinFET transistors. In some embodiments, each of the NMOS transistors 326 and 336 and the PMOS transistors 324, 328, 332, 334, 338 of the driver bias generator 204 are 5 nm FinFET transistors. In some embodiments, each of the driver structure transistors 302, 304, and 306, the NMOS transistors 326 and 336, and the PMOS transistors 324, 328, 332, 334, 338 are body-tie devices having their respective bulk terminals electrically coupled to their respective highest potential terminals to avoid forward-biasing bulk-drain or bulk-source parasitic diodes of these transistors.

The driver bias generator 204 also includes resistances 316, 318, 320, 322, and 325. The resistance 316 is coupled between the IC voltage supply 214 and a node 340 The resistance 318 is coupled between the node 340 and the ground 218. In some embodiments, the resistance 318 is about four times the resistance 316. The resistance 316 and the resistance 318 act as a first voltage divider that provides about 80% of the voltage VDD18 (1.44 V when VDD18 is at 1.8 V) at the node 340.

The resistance 320 is coupled between the bus 208 and a node 342. The resistance 322 is coupled between the node 342 and a node 344. The resistance 325 is coupled between the node 344 and the ground 218. The resistances 320, 322, and 325 are each about equal to one another, and form a second voltage divider that provides about 66% of the voltage VBUS at the node 342 and a third voltage divider that provides about 33% of the voltage VBUS at the node 344.

The PMOS transistor 324 has a source and bulk terminal that is coupled to a node 308, a gate terminal that is coupled to a node 312, and a drain terminal that is coupled to the node 342. The NMOS transistor 326 has a source and bulk terminal and a gate terminal that are each coupled to the node 312 and a drain terminal that is coupled to the node 308. The PMOS transistor 328 has a source and bulk terminal that is coupled to the node 308, a drain terminal that is coupled to the node 312, and a gate terminal that is coupled to the node 342 (i.e., the node interposed between the resistance 320 and the resistance 322). The PMOS transistor 332 has a source and bulk terminal that is coupled to the node 312, a gate terminal that is coupled to the node 340, and a drain terminal that is coupled to the node 344. The PMOS transistor 334 has a source and bulk terminal that is coupled to the node 312, a gate terminal that is coupled to the node 340, and a drain terminal that is coupled to a node 346. The NMOS transistor 336 has a source and bulk terminal that is coupled to the ground 218, a gate terminal that is coupled to the node 340, and a drain terminal that is coupled to the node 346. The PMOS transistor 338 has a source and bulk terminal that is coupled to the node 312, a gate terminal that is coupled to the node 346, and a drain terminal that is coupled to the node 340.

The first driver structure transistor 302 has a source and bulk terminal that is coupled to the ground 218, a gate terminal that is coupled to a data input node 216 and a drain terminal coupled to a node 314. The IC 202 selectively drives a data signal to the data input node 216 to set the data input node 216 to high or low logic voltages to, for example, drive data onto the bus 208. In some embodiments, the IC 202 supplies a logic high data signal (e.g., about 1.44 V) to the node 216 to transmit a logic low signal via the bus 208. The second driver structure transistor 304 has a source and bulk terminal coupled to the node 314, a gate terminal coupled to the node 312, and a drain terminal coupled to a node 310. The third driver structure transistor 306 includes a source and bulk terminal coupled to the node 310, a gate terminal coupled to the node 308, and a drain terminal coupled to the bus 208. The voltage at the gate of the first driver structure transistor 302 is referred to herein as NGATE1, the voltage at the gate of the second driver structure transistor 304 is referred to herein as NGATE2, and the voltage at the gate of the third driver structure transistor 306 is referred to herein as NGATE3.

Various examples of the states of each of the transistors of the driver bias generator 204 and the driver structure 206 will now be provided, given various combinations of values of the voltages VDD18, VBUS, and NGATE1. In these examples, a transistor is considered "active" when it provides an electrically conductive path between its source terminal and its drain terminal, PMOS transistors are active when their gates are biased with a logic low voltage (about 0 V in these examples), and NMOS transistors are active when their gates are biased with a logic high voltage (about 1.44 V in these examples).

In a first example, the voltage VBUS at the bus 208 is about 3.3 V (for example, a VDDE of 3.3 V pulls the voltage VBUS of the bus 208 to 3.3 V), the voltage VDD18 at the IC voltage supply 214 is about 1.8 V, and the voltage NGATE1 at the gate of the first driver structure transistor 302 (i.e., node 216) is about 0 V. The voltage at the node 308 is about 2.2 V, the voltage at the node 310 is about 2.2V minus the threshold voltage drop across the third driver structure transistor 306, the voltage at the node 312 is about 1.44 V, the voltage at the node 314 is about 1.44 V minus the threshold voltage drop across the second driver structure transistor 304, the voltage at the node 340 is about 1.44 V, the voltage at the node 342 is about 2.2 V, the voltage at the node 344 is about 1.1 V, and the voltage at the node 346 is about 0 V. The transistors 324, 326, 336, and 338 of the driver bias generator 204 are active, while the transistors 328, 332, and 334 of the driver bias generator 204 are inactive, each due to their respective source and gate voltages. The first driver structure transistor 302 is inactive, the second driver structure transistor 304 is active, and the third driver structure transistor 306 is active. The potential difference across any given one of the transistors of the driver bias generator 204 and the driver structure 206 is kept at or below 1.65 V (i.e., the maximum threshold voltage of these transistors in the present example).

In a second example, the voltage VBUS at the bus 208 is about 1.8 V (for example, a VDDE of about 1.8 V pulls the voltage VBUS of the bus 208 to about 1.8 V), the voltage VDD18 at the IC voltage supply 214 is about 1.8 V, and the voltage NGATE1 at the gate of the first driver structure transistor 302 (i.e., node 216) is about 0 V. The voltage at the node 308 is about 1.44 V, the voltage at the node 310 is about 1.44 V minus the threshold voltage drop across the third driver structure transistor 306, the voltage at the node 312 is about 1.44 V, the voltage at the node 314 is about 1.44 V minus the threshold voltage drop across the second driver structure transistor 304, the voltage at the node 340 is about 1.44 V, the voltage at the node 342 is about 1.2 V, the voltage at the node 344 is about 0.6 V, and the voltage at the node 346 is about 0 V. The transistors 326, 328, 336, and 338 of the driver bias generator 204 are active, while the transistors 324, 332, and 334 of the driver bias generator 204 are inactive, each due to their respective source and gate voltages. The first driver structure transistor 302 is inactive, the second driver structure transistor 304 is active, and the third driver structure transistor 306 is active. The potential difference across any given one of the transistors of the driver bias generator 204 and the driver structure 206 is kept at or below 1.65 V (i.e., the maximum threshold voltage of these transistors in the present example).

In a third example, the voltage VBUS at the bus 208 is about 0 V (for example, path to ground through the driver structure 206 pulls the voltage VBUS of the bus 208 to a ground voltage of about 0 V), the voltage VDD18 at the IC voltage supply 214 is about 1.8 V, and the voltage NGATE1 at the gate of the first driver structure transistor 302 (i.e., node 216) is about 1.44 V. The third example corresponds to a scenario in which the IC 202 is actively pulling the voltage VBUS of the bus 208 low (e.g., to send a logic low signal via the bus 208). In this case, the voltage VBUS at the bus 208 is not dependent on the voltage VDDE. The voltage at the node 308 is about 1.44 V, the voltage at the node 310 is about 1.44 V minus the threshold voltage drop across the third driver structure transistor 306, the voltage at the node 312 is about 1.44 V, the voltage at the node 314 is about 1.44 V minus the threshold voltage drop across the second driver structure transistor 304, the voltage at the node 340 is about 1.44 V, the voltage at the node 342 is about 0 V, the voltage at the node 344 is about 0 V, and the voltage at the node 346 is about 0 V. The transistors 326, 328, 336, and 338 of the driver bias generator 204 are active, while the transistors 324, 332, and 334 of the driver bias generator 204 are inactive, each due to their respective source and gate voltages. The first driver structure transistor 302 is active, the second driver structure transistor 304 is active, and the third driver structure transistor 306 is active. The potential difference across any given one of the transistors of the driver bias generator 204 and the driver structure 206 is kept at or below 1.65 V (i.e., the maximum threshold voltage of these transistors in the present example).

In a fourth example, the voltage VBUS at the bus 208 is about 3.3 V (for example, a VDDE of about 3.3 V pulls the voltage VBUS of the bus 208 to about 3.3 V), the voltage VDD18 at the IC voltage supply 214 is about 0 V, and the voltage NGATE1 at the gate of the first driver structure transistor 302 (i.e., node 216) is about 0 V. The voltage at the node 308 is about 2.2 V, the voltage at the node 310 is about 2.2 V minus the threshold voltage drop across the third driver structure transistor 306, the voltage at the node 312 is about 1.1 V, the voltage at the node 314 is about 1.1 V minus the threshold voltage drop across the second driver structure transistor 304, the voltage at the node 340 is about 0 V, the voltage at the node 342 is about 2.2 V, the voltage at the node 344 is about 1.1 V, and the voltage at the node 346 is about 1.1 V. The transistors 324, 326, 332, and 334 of the driver bias generator 204 are active, while the transistors 328, 336, and 338 of the driver bias generator 204 are inactive, each due to their respective source and gate voltages. The first driver structure transistor 302 is inactive, the second driver structure transistor 304 is active, and the third driver structure transistor 306 is active. The potential difference across any given one of the transistors of the driver bias generator 204 and the driver structure 206 is kept at or below 1.65 V (i.e., the maximum threshold voltage of these transistors in the present example).

In a fifth example, the voltage VBUS at the bus 208 is about 1.8 V (for example, a VDDE of about 1.8 V pulls the voltage VBUS of the bus 208 to about 1.8 V), the voltage VDD18 at the IC voltage supply 214 is about 0 V, and the voltage NGATE1 at the gate of the first driver structure transistor 302 (i.e., node 216) is about 0 V. The voltage at the node 308 is about 1.2 V, the voltage at the node 310 is about 1.2 V minus the threshold voltage drop across the third driver structure transistor 306, the voltage at the node 312 is about 0.6 V, the voltage at the node 314 is about 0.6 V minus the threshold voltage drop across the second driver structure transistor 304, the voltage at the node 340 is about 0 V, the voltage at the node 342 is about 1.2 V, the voltage at the node 344 is about 0.6 V, and the voltage at the node 346 is about 0.6 V. The transistors 324, 326, 332, and 334 of the driver bias generator 204 are active, while the transistors 328, 336, and 338 of the driver bias generator 204 are inactive, each due to their respective source and gate voltages. The first driver structure transistor 302 is inactive, the second driver structure transistor 304 is active, and the third driver structure transistor 306 is active. The potential difference across any given one of the transistors of the driver bias generator 204 and the driver structure 206 is kept at or below 1.65 V (i.e., the maximum threshold voltage of these transistors in the present example).

Figure 4:
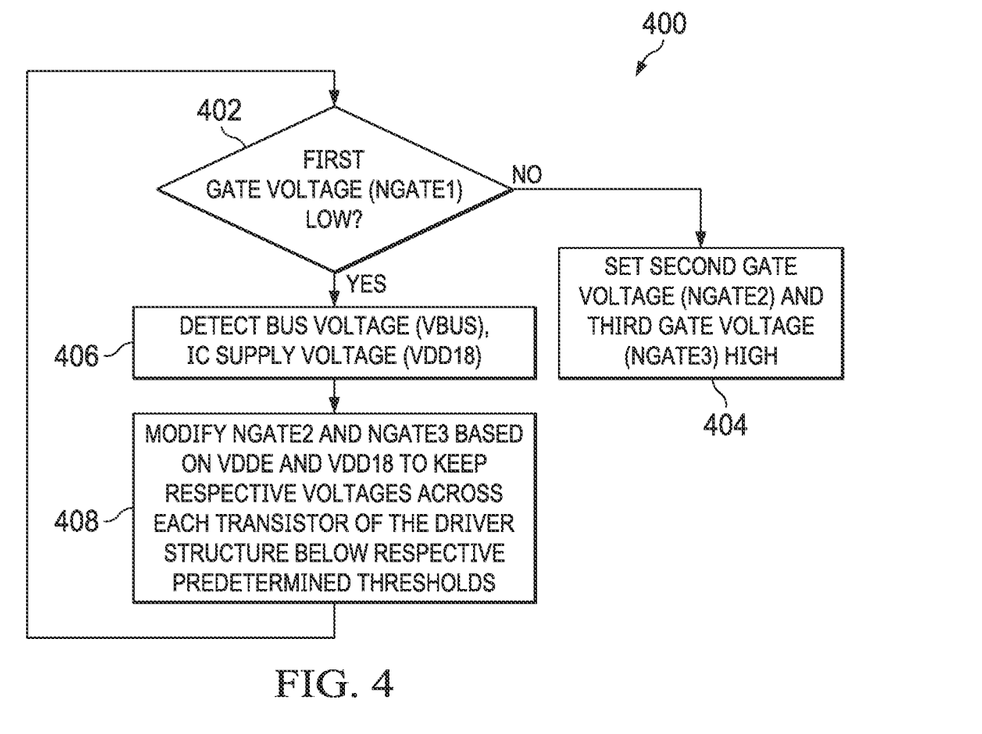
FIG. 4 is a flow diagram illustrating a method for selectively applying bias voltages to gates of transistors of a driver structure based on either or both of a bus voltage and an IC supply voltage, in accordance with some embodiments.

FIG. 4 illustrates a flow diagram of a method 400 for selectively applying bias voltages to gates of transistors of a driver structure based on either or both of a bus voltage and an IC supply voltage, in accordance with some embodiments. The method 400 is implemented in some embodiments of the system 200 shown in FIG. 2 or the system 300 shown in FIG. 3. Like reference numerals from the examples of the systems 200 and 300 of FIGS. 2 and 3 are used to refer to like components in the present example. In some embodiments, the method 400 is implemented using an embodiment of the driver bias generator 204.

At block 402, if the first gate voltage, NGATE1, is low (e.g., 0 V; logical low), the method 400 proceeds to block 406. Otherwise, the method 400 proceeds to block 404.

At block 404, while NGATE1 is high (e.g., 1.44 V; logical high), the driver bias generator 204 supplies both the second gate voltage, NGATE2, of the second driver structure transistor 304 and the third gate voltage, NGATE3, of the third driver structure transistor 306 at high levels (e.g., 1.44 V; logical high) to activate the second driver structure transistor 304 and the third driver structure transistor 306, respectively. In the present example, when "activated", a given driver structure transistor provides an electrically conductive path between its source and drain terminals. For example, if NGATE1 is high, indicating that the first driver structure transistor 302 is active, the second and third driver structure transistors 304 and 306 are also activated, providing a path to the ground 218, which pulls the bus 208 to the ground voltage (e.g., 0 V). Since the bus 208 is at the ground voltage in this scenario, the driver bias generator 204 does not further modify the voltages NGATE2 and NGATE3 to mitigate EOS while NGATE1 is high.

At block 406, while NGATE1 is low, the driver bias generator 204 detects the bus voltage, VBUS, (effectively sensed at the nodes 342 and 344, for example) and the IC supply voltage, VDD18, (effectively sensed at the node 340, for example).

At block 408, the driver bias generator 204 modifies the NGATE2 and NGATE3 voltages based on the detected voltages VBUS and VDD18 to keep respective voltages across each transistor of the driver structure 206 below respective predetermined thresholds. For some embodiments in which the first, second, and third driver structure transistors 302, 304, and 306 are 5 nm FinFET transistors, they each have a maximum operating voltage range of about 1.65 V. In such embodiments, the predetermined thresholds of the first, second, and third driver structure transistors 302, 304, and 306 are each about 1.65 V via application of appropriate NGATE2 and NGATE3 voltages to mitigate possible EOS issues. Examples of NGATE2 and NGATE3 voltages that are applied given various combinations of VBUS and VDD18 voltages are provided below.

Figure 5:
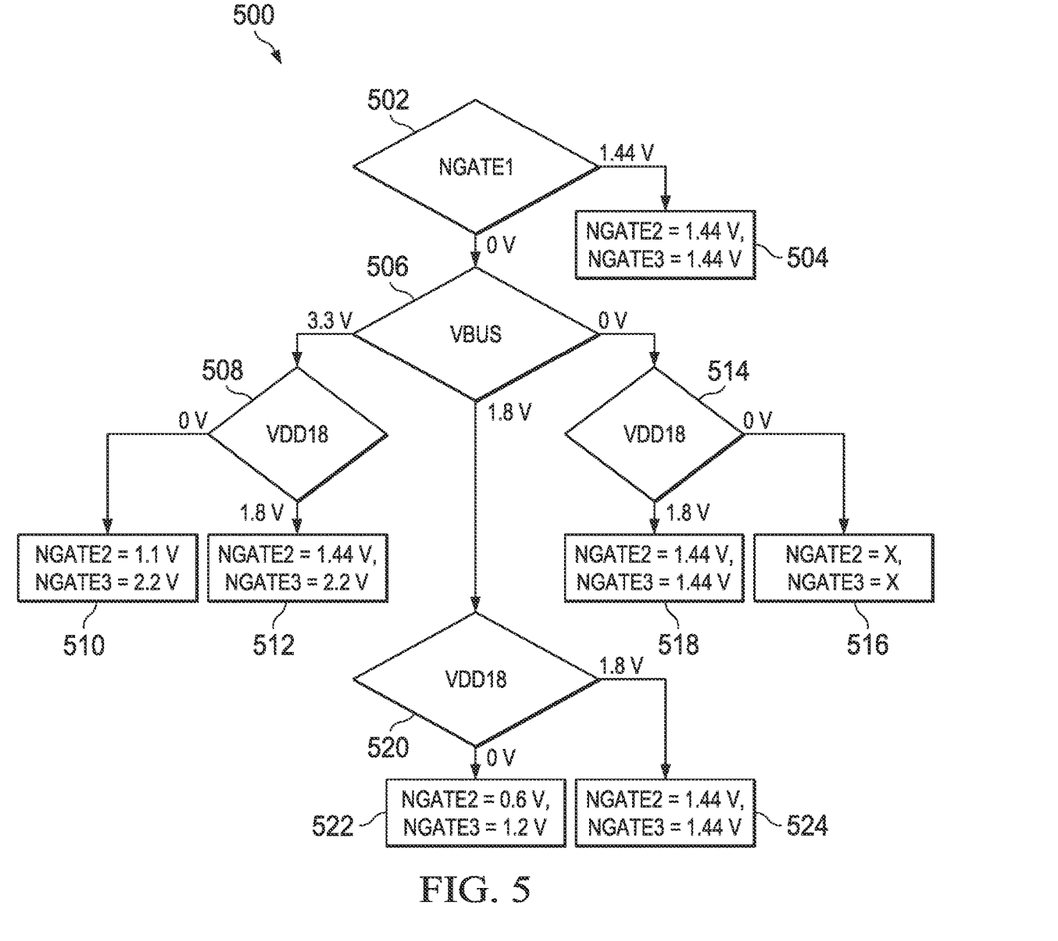
FIG. 5 is a flow diagram illustrating a method for determining the bias voltages to be applied to the gates of the transistors of the driver structure in an embodiment of the method of FIG. 4, in accordance with some embodiments.

FIG. 5 illustrates a flow diagram of a method 500 for selectively applying bias voltages to gates of transistors of a driver structure based on either or both of a bus voltage and an IC supply voltage for embodiments in which the bus voltage is 0 V, 1.8 V, or 3.3 V and the IC supply voltage is either 0 V or 1.8 V and in which the first, second, and third driver structure transistors 302, 304, and 306 each have a maximum operating voltage range of about 1.65 V. The method 500 is implemented in some embodiments of the system 200 shown in FIG. 2 or the system 300 shown in FIG. 3. Like reference numerals from the examples of the systems 200 and 300 of FIGS. 2 and 3 are used to refer to like components in the present example. In some embodiments, the method 500 is implemented using an embodiment of the driver bias generator 204.

At block 502, if the voltage NGATE1 at the first driver structure transistor 302 is about 0 V, the method 500 proceeds to block 506. Otherwise, if the voltage NGATE1 is about 1.44 V, the method 500 proceeds to block 504.

At block 504, the driver bias generator 204 supplies the voltage NGATE2 at the second driver structure transistor 304 at about 1.44 V and supplies the voltage NGATE3 at the third driver structure transistor 306 at about 1.44 V. This, in combination with the voltage NGATE1 being at 1.44 V, creates an electrical path between the bus 208 to the ground 218, effectively pulling the bus 208 to the ground voltage (e.g., about 0 V).

At block 506, if the bus voltage, VBUS, at the bus 208 is about 0 V then the method 500 proceeds to block 514, if VBUS is about 1.8 V then the method 500 proceeds to block 520, and if VBUS is about 3.3 V then the method 500 proceeds to block 508. It should be noted that when NGATE1 is about 0 V (i.e., logic low; not active), the bus voltage VBUS is assumed to be pulled up to the external supply voltage VDDE through the external pullup resistance 212. That is, the bus voltage VBUS is assumed to be about equal to VDDE when NGATE1 is low. For example, the driver bias generator 204 effectively senses VBUS at the nodes 342 and 344, which are biased to about 66% of the VBUS and about 33% of VBUS, respectively.

At block 508, if the IC supply voltage, VDD18, is about 0 V, the method 500 proceeds to block 510, and if VDD18 is about 1.8 V, the method 500 proceeds to block 512.

At block 510, the driver bias generator 204 supplies the voltage NGATE2 at the second driver structure transistor 304 at about 1.1 V and supplies the voltage NGATE3 at the third driver structure transistor 306 at about 2.2 V.

At block 512, the driver bias generator 204 supplies the voltage NGATE2 at the second driver structure transistor 304 at about 1.44 V and supplies the voltage NGATE3 at the third driver structure transistor 306 at about 2.2 V.

At block 514, if the IC supply voltage, VDD18, is about 0 V, the method 500 proceeds to block 516, and if VDD18 is about 1.8 V, the method 500 proceeds to block 518.

At block 516, the voltages NGATE2 and NGATE3 supplied by the driver bias generator 204 to the second driver structure transistor 304 and the third driver structure transistor 306, respectively, are considered "don't-care", denoted here as "X". That is, the voltages supplied by the driver bias generator 204 do not matter in this case, since the voltages NGATE1, VBUS, and VDD18 are all around 0 V, meaning that no voltages should be available to cause EOS issues at any of the driver structure transistors 302, 304, and 306. While the voltages at NGATE2 and NGATE3 are considered "don't-care" in this case, it should be noted that in a silicon based system the voltages NGATE2 and NGATE3 will typically be pulled toward 0 V due to device leakage and the 0 V NGATE1, VBUS, and VDD18 voltage.

At block 518, the voltages at driver bias generator 204 supplies the voltage NGATE2 at the second driver structure transistor 304 at about 1.44 V and supplies the voltage NGATE3 at the third driver structure transistor 306 at about 1.44 V.

At block 520, if the IC supply voltage, VDD18, is about 0 V, the method 500 proceeds to block 522, and if VDD18 is about 1.8 V, the method 500 proceeds to block 524.

At block 522, the voltages at driver bias generator 204 supplies the voltage NGATE2 at the second driver structure transistor 304 at about 0.6 V and supplies the voltage NGATE3 at the third driver structure transistor 306 at about 1.2 V.

At block 524, the voltages at driver bias generator 204 supplies the voltage NGATE2 at the second driver structure transistor 304 at about 1.44 V and supplies the voltage NGATE3 at the third driver structure transistor 306 at about 1.44 V.

In some embodiments, the apparatus and techniques described above are implemented in a system including one or more IC devices (also referred to as integrated circuit packages or microchips), such as the ICs 102, 104, and 202 described above with reference to FIGS. 1-3. Electronic design automation (EDA) and computer aided design (CAD) software tools may be used in the design and fabrication of these IC devices. These design tools typically are represented as one or more software programs. The one or more software programs include code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory) or coupled to the computer system via a wired or wireless network (e.g., network accessible storage (NAS)).

In some embodiments, certain aspects of the techniques described above may implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An integrated circuit (IC) device comprising:
 a driver structure comprising:
  at least a first transistor;
  a second transistor coupled to the first transistor; and
  a third transistor coupled between the second transistor and a ground terminal, the first transistor being coupled between the second transistor and a bus; and
 a driver bias generator coupled to the driver structure, the driver bias generator configured to apply at least a first bias voltage to the first transistor based at least on a detected bus voltage, the first bias voltage preventing a voltage drop across the first transistor from exceeding a maximum operating voltage associated with the first transistor.

2. The IC device of claim 1, wherein the driver bias generator is configured to apply a second bias voltage to the second transistor, the first bias voltage and the second bias voltage preventing any voltage drop across either of the first transistor and the second transistor from exceeding the maximum operating voltage.

3. The IC device of claim 2, wherein the maximum operating voltage is approximately 1.65 V.

4. The IC device of claim 1, wherein the first transistor is a deep N-well device fin field effect transistor (FinFET) device fabricated via a 5 nm lithographic process.

5. The IC device of claim 1, wherein the first transistor is configured to drive electronic communication in a serial communication network via the bus.

6. The IC device of claim 1, further comprising:
 an IC voltage supply configured to provide an IC supply voltage at the driver bias generator, wherein the driver bias generator is configured to apply the first bias voltage to the first transistor based on both the detected bus voltage and the IC supply voltage.

7. The IC device of claim 1, wherein the driver bias generator comprises at least one FinFET device fabricated via a 5 nm lithographic process.

8. The IC device of claim 1, wherein the driver bias generator includes body-tie devices having their respective bulk terminals electrically coupled to their respective highest potential terminals.

9. The IC device of claim 1, wherein the driver bias generator includes a plurality of voltage dividers.

10. A system comprising:
 a bus;
 at least one voltage supply coupled to the bus and configured to supply at least one voltage signal to the bus; and
 an integrated circuit (IC) device coupled to the bus, the IC device comprising:
  a driver structure that is coupled to the bus and that comprises at least:
   a first transistor;
   a second transistor coupled to the first transistor;
   a third transistor coupled between the second transistor and a ground terminal, the first transistor being coupled between the second transistor and the bus; and
  a driver bias generator coupled to the driver structure and to the bus, the driver bias generator configured to apply at least a first bias voltage to limit a voltage drop across the first transistor based at least on a bus voltage of the bus.

11. The system of claim 10, wherein the first bias voltage applied by the driver bias generator prevents the voltage drop across the first transistor from exceeding a maximum operating voltage associated with the first transistor.

12. The system of claim 11, wherein the driver bias generator is configured to apply a second bias voltage to the second transistor, the first bias voltage and the second bias voltage preventing any voltage drop across either of the first transistor and the second transistor from exceeding respective maximum operating voltages of the first transistor and the second transistor.

13. The system of claim 12, wherein the IC device further comprises:
 an IC voltage supply configured to provide an IC supply voltage at an input of the driver bias generator, wherein the driver bias generator is configured to apply the first bias voltage to the first transistor and the second bias voltage to the second transistor based on both the bus voltage and the IC supply voltage.

14. The system of claim 12, wherein the first transistor and the second transistor are each deep N-well fin field effect transistor (FinFET) devices fabricated using a 5 nm lithographic process, and each of the respective maximum operating voltages of the first transistor and the second transistor is approximately 11.65 V.

15. The system of claim 10, wherein the voltage signal applied to the bus by the at least one voltage supply is a 1.8 V signal or a 3.3 V signal.

16. A method comprising:
 detecting a bus voltage of a bus;
 detecting a supply voltage of a voltage supply of an integrated circuit (IC) device; and
 applying at least a first bias voltage to a driver structure based on the bus voltage and the supply voltage;
 applying a second bias voltage to the driver structure based on the bus voltage and the supply voltage concurrently with applying the first bias voltage; and
 responsive to a logic low voltage at a data input node of a transistor of the driver structure, applying a logic high voltage as both the first bias voltage and the second bias voltage.

17. The method of claim 16, wherein the first bias voltage and the second bias voltage, when applied, prevent respective voltage drops across components of the driver structure from exceeding respective maximum operating voltages associated with the components of the driver structure.

18. The method of claim 17, wherein applying at least the first bias voltage to the driver structure based on the bus voltage and the supply voltage comprises:
 applying the first bias voltage to a first transistor of the driver structure, the first transistor being directly coupled to the bus.

19. The method of claim 18, wherein applying the second bias voltage to the driver structure based on the bus voltage and the supply voltage comprises:

applying the second bias voltage to a second transistor of the driver structure, the second transistor being coupled between the first transistor of the driver structure and a third transistor of the driver structure.

\* \* \* \* \*